United States Patent [19]

Tobita

[11] Patent Number: 5,115,412
[45] Date of Patent: May 19, 1992

[54] DATA READ CIRCUIT OF SEMICONDUCTOR MEMORY DEVICE AND METHOD OF READING DATA OUT

[75] Inventor: Youichi Tobita, Hyogo, Japan

[73] Assignee: Mitsubishi Denki Kabushiki Kaisha, Tokyo, Japan

[21] Appl. No.: 425,272

[22] Filed: Oct. 23, 1989

[30] Foreign Application Priority Data

Oct. 24, 1988 [JP] Japan .................................. 63-267388

[51] Int. Cl.⁵ .............................................. G11C 7/00
[52] U.S. Cl. ................................. 365/189.09; 365/190
[58] Field of Search ..................... 365/189.09, 189.11, 365/203, 226, 190

[56] References Cited

U.S. PATENT DOCUMENTS

| 4,272,834 | 6/1981 | Noguchi et al. ................. | 365/174 |
|---|---|---|---|
| 4,507,759 | 3/1985 | Yasui et al. ..................... | 365/154 |
| 4,592,021 | 5/1986 | Suzuki et al. .................... | 365/203 |
| 4,670,706 | 6/1987 | Tobita ............................. | 323/313 |

FOREIGN PATENT DOCUMENTS

3521480A1 7/1985 Fed. Rep. of Germany .

*Primary Examiner*—Joseph A. Popek
*Attorney, Agent, or Firm*—Lowe, Price, LeBlanc & Becker

[57] ABSTRACT

A semiconductor memory device includes a data output bus (I/O, I/O; CD, $\overline{CD}$; DB) for transmitting therethrough a read-out potential of a selected one of memory cells (1; MC), and an amplifier circuit (3; 3') for detecting and amplifying a potential on this data output bus. This semiconductor memory device further includes a circuit (Q6, Q7; Q6, Q7, Q12, Q13) for charging the data output bus from a first power supply to a first potential, and a circuit (Q8, Q9, 5; 5', Q8, Q9) for detecting the potential on the data output bus and being activated responsive to shifting of this data output bus potential in the direction of a first supply potential for coupling the data output bus potential to a second power supply to recover the same to the first potential at a high speed. When the data output bus rises in potential above the first potential, the charging circuit does not function, but the recovering circuit functions to recover the potential on this data output bus to the first potential at a high speed by coupling the data input/output bus to a second supply potential. The recovering circuit includes insulated gate type field effect transistors Q8 and Q9 having their gates supplied with a voltage obtained by lowering the first potential further by threshold voltages of these insulated gate type field effect transistors.

19 Claims, 6 Drawing Sheets

DATA READ CIRCUIT OF SEMICONDUCTOR MEMORY DEVICE AND METHOD OF READING DATA OUT

BACKGROUND OF THE INVENTION

1. Field of the Invention

The present invention relates generally to semiconductor devices and, more particularly, to improvements in a circuit for reading data in a semiconductor memory device. More specifically, it relates to a configuration of a data read circuit for providing an assured optimal circuit operation even in the event of potential changes in a supply voltage.

2. Description of the Related Art

FIG. 1 illustrates a schematic configuration of an entire data read portion of a dynamic random access memory (DRAM) which is one of semiconductor memory devices. Referring to FIG. 1, the DRAM includes a memory cell array MA, an address buffer AB, an X decoder ADX, a Y decoder ADY, a sense amplifier and input/output circuit SI, and an output buffer circuit OB.

The memory cell array MA includes a plurality of memory cells arranged in matrix, each of which stores information.

The address buffer AB receives an external address signal A externally applied to generate an internal address signal a and applies the same to the X decoder ADX and Y decoder ADY. The address buffer AB receives a row address and a column address in a time division multiplexing manner.

The X decoder ADX receives the internal address signal a from the address buffer AB to generate a signal for selecting a corresponding row of the memory cell array MA.

The Y decoder ADY receives the internal address signal a from the address buffer AB to select a corresponding column or columns of the memory cell array MA. Timings that the X decoder ADX and Y decoder ADY receive the row address and the column address are, for example, provided by a $\overline{RAS}$ signal and a $\overline{CAS}$ signal, respectively. The signal $\overline{RAS}$ defines the timing that the X decoder receives a row address, while the signal $\overline{CAS}$ defines the timing that the Y decoder ADY accepts a column address.

The sense amplifier and input/output circuit SI is a circuit block including sense amplifiers and an input/output circuit. The sense amplifiers sense and amplify information stored in the selected memory cells of the memory cell array MA. The input/output circuit connects a corresponding column of the memory cell array MA to the output buffer circuit OB in response to a decoded address signal from the Y decoder ADY. That is, the input/output circuit SI outputs information of the selected memory cell or cells as read-out data $D_R$ to the output buffer OB in response to the decoded address signal from the Y decoder ADY.

The output buffer circuit OB is activated responsive to a clock signal $\phi_S$ and receives the read-out data $D_R$ to convert the data into corresponding external output data $D_{OUT}$ and output the same.

A control signal generator circuit CG is provided as a peripheral circuit for controlling various operation timings of the DRAM. The control signal generator circuit CG generates a precharge potential VB for precharging bit lines, a word line driving signal $R_n$ for driving a selected word lines, a sense up activating signal $\phi_S$ for activating the output buffer circuit OB, and sense amplifier activating signals $\phi_A$ and $\phi_B$.

FIG. 2 shows a schematic configuration of the memory cell array MA in FIG. 1. Referring to FIG. 2, the memory cell array MA includes a plurality of bit line pairs BP0, BP1, ..., BPm arranged in a column direction, and a plurality of word lines WL1, WL2, ..., WLn arranged in a row direction intersecting with the bit line pairs BP0-BPm. A bit line pair BP (the BP is a general denotation for the bit line pairs BP0-BPm) includes complementary bit lines BL and $\overline{BL}$. That is, the bit line pair BP0 includes a bit line BL0 and a complementary bit line $\overline{BL0}$, and the bit line pair BP1 includes bit lines BL1 and $\overline{BL1}$. Similarly, the bit line pair BPm includes bit lines BLm and $\overline{BLm}$. This bit line pair BP provides a so-called "folded bit line scheme", and thus a single memory cell 1 is provided at respective intersections of each bit line pair BP and each word line WL.

The bit line pair BP is provided with a precharge/equalizing circuit 2 for equalizing and precharging to a predetermined potential VB potentials on the bit lines BL and $\overline{BL}$ of the bit line pair BP during a $\overline{RAS}$ precharge period (while the signal RAS is logical high or at the H level).

The bit line pair BP is further provided with a sense amplifier 50 for sensing and differentially amplifying a potential difference between the bit lines BL and $\overline{BL}$. The sense amplifier 50 is activated responsive to the sense amplifier activating signals $\phi_A$ and $\phi_B$. The sense amplifier 50 is supplied with two kinds of the activating signals $\phi_A$ and $\phi_B$ because the sense amplifier has normally such function as to discharge the potential on a lower potential bit line to a ground potential and boost the potential on the other higher potential bit line up to a supply voltage Vcc level, and thus it needs to be provided with timings to activate these charging and discharging operations.

Transfer gates T0 and T0', T1 and T1', ..., Tm and Tm' are provided between the bit line pair BP and data input/output buses I/O and $\overline{I/O}$, which selectively connect the bit lines responsive to the decoded address signal from the Y decoder ADY. The transfer gates T0 and T0' connect the bit lines BL0 and $\overline{BL0}$ to the data input/output buses I/O and $\overline{I/O}$, respectively, in response to an decoded address signal AD0. The transfer gates T1 and T1' connect the bit lines BL1 and $\overline{BL1}$ to the data input/output buses I/O and $\overline{I/O}$, respectively, in response to a decoded column address signal AD1. The transfer gates Tm and Tm' connect the bit lines BLm and $\overline{BLm}$ to the data input/output buses I/O and $\overline{I/O}$, respectively, in response to a decoded column address signal ADm. An operation in data reading will now be described briefly.

First of all, the potentials on the bit lines BL and $\overline{BL}$ are precharged at a predetermined potential VB by the precharge/equalizing circuit 2. When a memory cycle is started, an external row address signal is accepted into an internal portion of the memory and transmitted to the X decoder ADX after the precharge was completed. The X decoder ADX decodes this internal row address signal to generate a signal for selecting a corresponding word line. Accordingly, the word line driving signal Rn is transmitted onto the selected word line, thereby raising the potential on this selected word line. As a result, in the case that the word line WL1 is selected, for example, memory cell data are transmitted on the bit lines BL, while the bit lines $\overline{BL}$ holds the precharge potential. The sense amplifiers 50 are then activated responsive to the activating signals $\phi_A$ and $\phi_B$ to sense and differentially amplify a potential difference on associated bit line pairs. After the potential difference on the bit line pair BP is established, a decoded column address signal is outputted from the Y decoder ADY to select one bit line pair, so that this selected bit line pair is connected to the data input/output buses I/O and $\overline{\text{I/O}}$ via the transfer gates. The data transmitted to the data input/output buses I/O and $\overline{\text{I/O}}$ is transmitted as read-out data $D_R$ to the output buffer circuit OB. The configuration of and operation of the output buffer circuit OB will now be described with reference to FIG. 3.

FIG. 3 only shows an output buffer circuit OB connected to a pair of the data input/output buses I/O and $\overline{\text{I/O}}$. It should be noted that in a normal DRAM, the memory cell array MA is divided into a plurality of blocks. Therefore, the data input/output buses are provided corresponding to each of the divided blocks, and the output buffer circuit is provided corresponding to each pair of the data input/output buses.

Referring to FIG. 3, the output buffer circuit OB includes a current mirror type amplifier 3 for differentially amplifying a potential difference between the pair of data input/output buses I/O and $\overline{\text{I/O}}$, and an output driver 4 for deriving output data $D_{OUT}$ responsive to an output of this current mirror type amplifier 3.

The current mirror type amplifier 3 includes n channel MOSFETs (insulated gate type field effect transistors) Q1, Q2 and Q5 and p channel MOSFETs Q3 and Q4. The n MOSFET Q1 has its gate connected to an internal data input/output line DL, its drain connected to a node N1 and its source connected to the drain of the n channel MOS transistor Q5. The n channel MOSFET Q2 has its gate connected to an internal data input/output line $\overline{\text{DL}}$, its drain connected to a node N2 and its source connected to the drain of the n channel MOSFET Q5. The p channel MOSFET Q3 has its source connected to a first supply potential Vcc, its gate connected to the node N2 and its drain connected to the node N1. The p channel MOSFET Q4 has its gate and drain connected to the node N2 and its source connected to the first supply potential Vcc. The n channel MOSFET Q5 has its gate connected to receive the sense up activating signal $\phi_S$, its drain connected to the respective sources of the n channel MOSFETs Q1 and Q2, and its source coupled to a second supply potential (the ground potential).

The p channel MOSFETs Q3 and Q4 form a current mirror circuit and also function as loads for the n channel MOSFETs Q1 and Q2. The n channel MOSFET Q5 activates this current mirror type amplifier 3 responsive to the sense up activating signal $\phi_S$ and also functions to keep constant a current flowing therethrough.

Data being complementary with each other are outputted from the nodes N1 and N2 to be sent to the output driver 4.

Diode-connected n channel MOS transistors Q6 and Q7 are provided to bias the potentials on the data input/output buses I/O and $\overline{\text{I/O}}$, i.e., the internal data input/output lines DL and $\overline{\text{DL}}$ to a predetermined potential. The n channel MOSFET Q6 has its gate and drain connected to the first supply potential Vcc, and its source connected to the data input/output bus I/O. The n channel MOSFET Q7 has its gate and drain connected to the first supply potential Vcc and its source connected to the data input/output bus $\overline{\text{I/O}}$. These diode-connected MOSFETs Q6 and Q7 bias the data input/output buses I/O and $\overline{\text{I/O}}$ to the potential of (Vcc $-$ V$_{TN}$), respectively. The V$_{TN}$ presents threshold voltages of the n channel MOSFETs. An operation of the output buffer circuit OB will now briefly be described.

As has been described, the data of the selected memory cell is transmitted onto the data input/output buses I/O and $\overline{\text{I/O}}$ by the Y decoder ADY. Accordingly, the potential on one of the data input/output buses I/O and $\overline{\text{I/O}}$ charged to the potential (Vcc $-$ V$_{TN}$) is lowered, which is connected to the bit line of logical low or the L level. Meanwhile, the potential on the other data input/output bus connected to the bit line of the H level is not lowered but maintained at the potential of (Vcc $-$ V$_{TN}$). This is possible because a parasitic capacitance of the data input/output buses I/O and $\overline{\text{I/O}}$ is fairly larger than that of the bit lines BL, thereby less causing a rise in potential.

The potential difference occurring between the data input/output buses I/O and $\overline{\text{I/O}}$ is amplified by activating the current mirror type amplifier circuit 3 in response to the sense up activating signal $\phi_S$. The amplified data is transmitted to the output driver 4 to be converted into an external data Dout therein and outputted to the outside of the device.

The current mirror type amplifier circuit 3 including the differential MOSFETs Q1 and Q2 at its input portion has its sensitivity usually influenced by the levels of bias potentials applied to its input terminals (the gates of the MOSFETs Q1 and Q2). That is, when the bias voltages applied to the input terminals of the amplifier circuit 3 are raised above a certain voltage level, a voltage to be applied to the drain of the constant current MOSFET Q5 is raised responsively. It should be noted here that the MOSFETs Q1 and Q2 are ON due to the bias voltages of the data input/output buses I/O and $\overline{\text{I/O}}$ In the case that the amplifier circuit 3 operates at a voltage such as of +5V, the constant current MOSFET Q5 does not provide an ideal constant current characteristic because its drain voltage is limited to a comparatively low value. Therefore, the drain current of the constant current MOSFET Q5 is increased by raising its drain voltage. The increase in the drain current of the constant current MOSFET Q5 increases the drain currents of the MOSFETs Q1 and Q2 at the input portion of the amplifier circuit 3. In this case, when the potential on the complementary data input/output bus $\overline{\text{I/O}}$ (i.e., the internal data input/output line $\overline{\text{DL}}$) becomes lower than that on the internal data input/output bus I/O (i.e., the data input/output line DL) in accordance with the read-out data, the drain current of the MOSFET Q1 is increased, while that of the MOSFET Q2 is decreased. As a result, the potential on the node N1 is lowered, so that a voltage signal of the L level is transmitted from the node N1 to the output driver 4.

In contrast, when the potential on the data input/output bus I/O becomes lower than that on the complementary data input/output bus $\overline{\text{I/O}}$ the drain current of the MOSFET Q1 is decreased, while that of the MOSFET Q2 is increased. As a result, a signal of the H level is outputted from the node N1. In this case, however, a drain voltage of the MOSFET Q2 is lowered by a voltage developing across the source and drain of the p channel MOSFET Q4. Therefore, the increase in the drain current of the MOSFET Q2 is comparatively small. The potential on the node N2 is fed back to the gate of the p channel MOSFET Q3. Thus, the increase in a voltage to be applied across the gate and source of the MOSFET Q3 is limited to a comparatively small value. Accordingly, the increase in the drain current of the MOSFET Q3 becomes comparatively small. Despite the fact that the drain current of the MOSFET Q1 is increased by the increase in the drain current of the constant current MOSFET Q5, the increase in the drain current of the MOSFET Q3 is comparatively small, so that the high level signal to be outputted from the node N1 attains a comparatively low level.

In the case that a gain of the amplifier circuit 3 is increased by making drain-source conductances of the MOSFETs Q3 and Q4 comparatively small, the level of the high level signal is lowered remarkably as the bias voltage to be applied to the pair of input terminals is raised. This level lowering of the high level signal from the amplifier circuit 3 prevents the output driver 4 from performing an accurate data deriving operation.

When the bias voltage to be applied to the input terminal pair of the amplifier circuit 3 is lowered below a certain value, the drain current of the constant current MOSFET Q5 is decreased. This decrease in the drain current of the constant current MOSFET Q5 causes a decrease in a charging current to be supplied to an input capacitance of the output driver 4 via the MOSFET Q3 or a decrease in a discharging current to be supplied to the input capacitance of the output driver 4 via the MOSFET Q1, thereby reducing the operation speed of the amplifier circuit 3.

Bias potentials on the data input/output buses I/O and I/O are lowered to appropriate levels by the MOSFETs Q6 and Q7. That is, respective potentials on the data input/output buses I/O and I/O are set to the appropriate level (Vcc−$V_{TN}$) by the MOSFETs Q6 and Q7 in order to improve the operation speed and the sensitivity of the amplifier circuit 3 and perform an accurate data reading operation.

It is empirically known and disclosed, for example, in U.S. Pat. No. 4,507,759 that the amplifier circuit 3 has its sensitivity enhanced by biasing respective potentials on the data input/output buses I/O and I/O to the level (Vcc−$V_{TN}$) and thus operates in an optimal state.

In general, it is desired for an integrated circuit to be assured of performing an accurate circuit operation even with a fluctuation of the supply voltage. Therefore, the circuit need be designed so as to perform the circuit operation in the optimal state even if the supply voltage Vcc fluctuates in the range of approximately ±10%. A description will now be given on an operation of the amplifier circuit 3 in the fluctuation of the supply voltage.

FIG. 4 schematically shows the fluctuation in the potential $V_{IO}$ of the data input/output buses I/O and I/O (hereinafter referred to as "input/output potential $V_{IO}$") in accordance with the fluctuation of the supply voltage Vcc.

As shown in FIG. 4, Vcc 1 indicates a normal supply potential, and Vcc 2 indicates a potential rise by ΔV above the normal supply potential Vcc 1.

The supply voltage Vcc is at the level of the Vcc 1 during the time period t0−t1. In this state, the diode-connected n channel MOSFETs Q6 and Q7 are both ON, and therefore the input/output potential $V_{IO}$ is set to a desired potential (Vcc 1−$V_{TN}$).

It is now assumed that the supply voltage Vcc is raised by ΔV toward the potential Vcc 2 for some causes from the time t1 to the time t2. The MOSFETs Q6 and Q7 are both ON also during this period, so that the input/output potential $V_{IO}$ also rises as the supply voltage Vcc rises. The potential $V_{IO}$ of the data input/output buses I/O and I/O is finally set to the level of (Vcc 2−$V_{TN}$).

The MOSFETs Q6 and Q7 are both ON during the period from the time t2 to the time t3 when the supply voltage Vcc is kept at the potential Vcc 2, so that the input/output potential $V_{IO}$ is also set to the potential of the (Vcc 2−$V_{TN}$).

The raised supply voltage Vcc is lowered from the vcc 2 to the Vcc 1 during the period from the time t3 to the time t4 after the time Δt1 has elapsed. In this case, the potential on the data input/output buses I/O and I/O is at the (Vcc 2−$V_{TN}$), so that the diode-connected MOSFETs Q6 and Q7 are turned off because their anodes are on the side of the supply voltage Vcc. As a result, a current does not flow from the data input/output buses I/O and I/O to a power supply Vcc, and thus the input/output potential $V_{IO}$ is not lowered in accordance with the lowering of the potential of the supply voltage Vcc.

Consequently, the input/output potential $V_{IO}$ is gradually discharged through the MOSFETs Q6 and Q7 or a "leak resistance" (a reverse resistance at an PN junction) being parasitic to the data input/output buses I/O and I/O. Accordingly, the input/output potential $V_{IO}$ is slowly lowered to reach the potential (Vcc 1−$V_{TN}$) at the time t5 delayed by Δt2 from the time t4. This time period Δt2 is, for example, several hundreds mili seconds to several seconds long, which is not a negligible length for the circuit operation.

As described above, in the case that the supply voltage Vcc is once raised above the normal supply potential Vcc 1 and again recovered to the potential Vcc 1, the recovery of the input/output potential $V_{IO}$ is considerably delayed. As a result, the input/output potential $V_{IO}$ is set higher than the potential (Vcc−$V_{TN}$) during the period from the time t3 to the time t5, thereby degrading the amplifiability and sensitivity of the current mirror type amplifier circuit 3, and thus optimal operations of the output circuit OB such as the optimal operation speed and detecting sensitivity are not guaranteed.

Such configuration is disclosed in the aforementioned U.S. Pat. No. 4,507,759 by Yasui et al that a common data line potential is biased to the potential (Vcc−$V_{TN}$) in a static memory, and also a higher resistance for holding this bias potential is provided on the common data line. However, the prior art reference only discloses therein a configuration that the common data line is biased to a predetermined potential only in operation of the current mirror type amplifier circuit, and hence the reference is not directed to a problem concerning a potential fluctuation of the common data line which is accompanied by the fluctuation in the supply voltage.

Such configuration is disclosed in the U.S. Pat. No. 4,670,706 by Tobita that a p channel MOS transistor is provided between an output terminal and ground to make an output voltage of a voltage generating circuit stable. In this prior art, the voltage generating circuit has p channel and n channel MOSFETs connected complementarily with each other at an output stage, and thus a noise voltage is removed and also power consumption is reduced by operating these MOSFETs at the output stage at a critical state between a conductive state and a non-conductive state.

SUMMARY OF THE INVENTION

It is an object of the present invention to provide an improved semiconductor memory device operating accurately even with a fluctuation in a supply voltage.

It is another object of the present invention to provide a semiconductor memory device capable of performing accurate and fast data reading even with a fluctuation in the supply voltage.

It is a further object of the present invention to provide a semiconductor memory device comprising a data read circuit operating under optimal designed conditions without being affected by the fluctuation in the supply voltage.

It is a still further object of the present invention to provide a circuit configuration of applying a bias voltage sufficiently following the fluctuation in the supply voltage to a data input/output line in a semiconductor memory device of a data output line bias system.

It is still another object of the present invention to provide a circuit configuration for operating a current mirror type amplifier for sensing and amplifying read data always under optimal conditions even if the supply voltage fluctuates.

It is a further object of the present invention to provide a method of performing fast and accurate data reading with high sensitivity even if the supply voltage fluctuates.

It is a still further object of the present invention to provide a method of operating a current mirror type amplifier for sensing/amplifying read data always under optimal conditions even if the supply voltage fluctuates.

The semiconductor memory device according to the present invention includes a data output bus for transmitting data of a selected memory cell, and a current mirror type amplifier for sensing and amplifying a signal potential on the data output bus. The semiconductor memory device of the present invention further includes a first potential setting circuit for setting a potential on the data output bus to a first potential, and a second potential setting circuit for detecting the potential on the data output bus and being activated responsive to this detected potential for setting the potential on the data output bus to the first potential.

The first potential setting circuit includes a charging circuit provided between a first supply potential and the data output bus. The second potential setting circuit includes first circuitry activated in response to detection of the potential shift on the data output bus toward the first supply potential with respect to the first potential for coupling the data output bus to a second power supply, and a control circuit for controlling an operation of the first circuitry. This control circuit inactivates the second potential setting circuit in response to the setting of the potential on the data output bus to the first potential by the activated second potential setting circuit.

Preferably, in the case that the charging circuit is formed of a diode-connected first transistor of a first conductivity type, the first circuitry is formed of a second transistor of a second conductivity type provided between the data output bus and the second power supply.

The control circuit applies to the gate of the second transistor of the second potential setting circuit, a voltage obtained by shifting in the direction of the second supply potential the first supply potential by the sum of a threshold voltage of the first transistor of the charging circuit and that of the second transistor.

The data output bus has a potential set to the first potential by the first potential setting circuit via the first supply potential. When the data output bus has a potential shifted depending on the fluctuation in the first supply potential and thus the first potential setting circuit does not function, the second potential setting circuit functions so as to shift the potential shifted to the direction of the first supply potential in the opposite direction thereto and recovers this potential to the first potential. Accordingly, the potential on the data output bus can follow the fluctuation in the supply potential at a high speed.

Consequently, it becomes possible for the data reading amplifier to operate always under optimal conditions even if the supply potential fluctuates.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
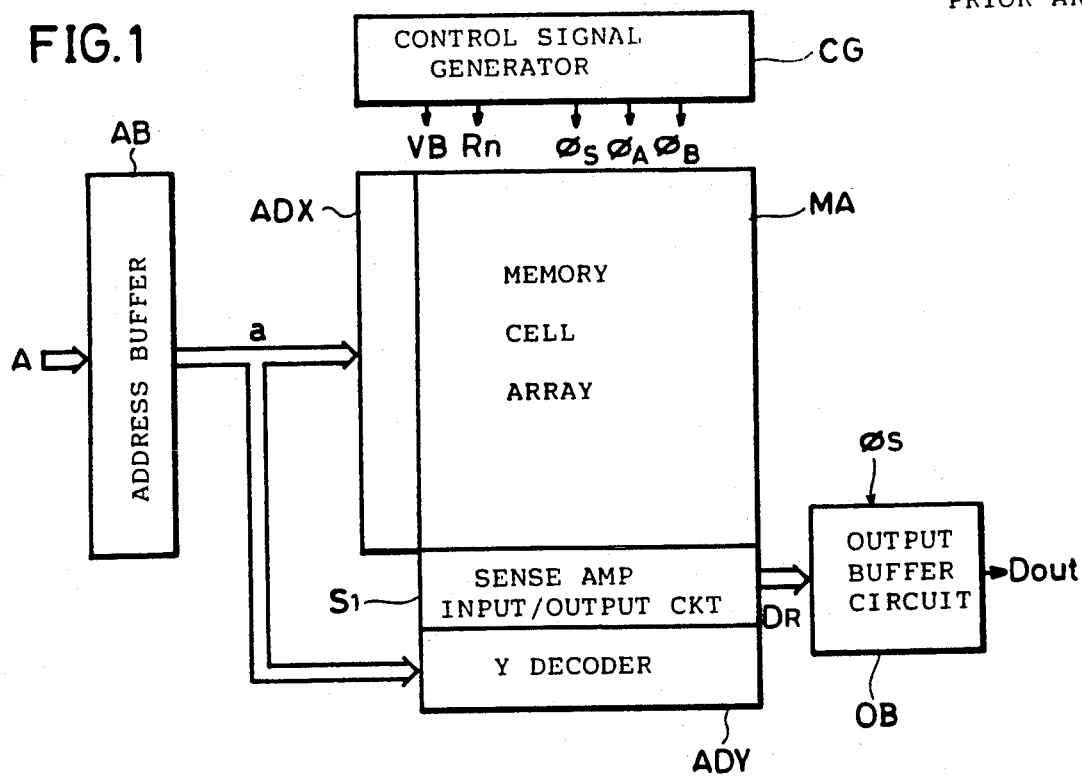
FIG. 1 is a diagram illustrating schematically the entire configuration of a conventional DRAM.
Figure 2:
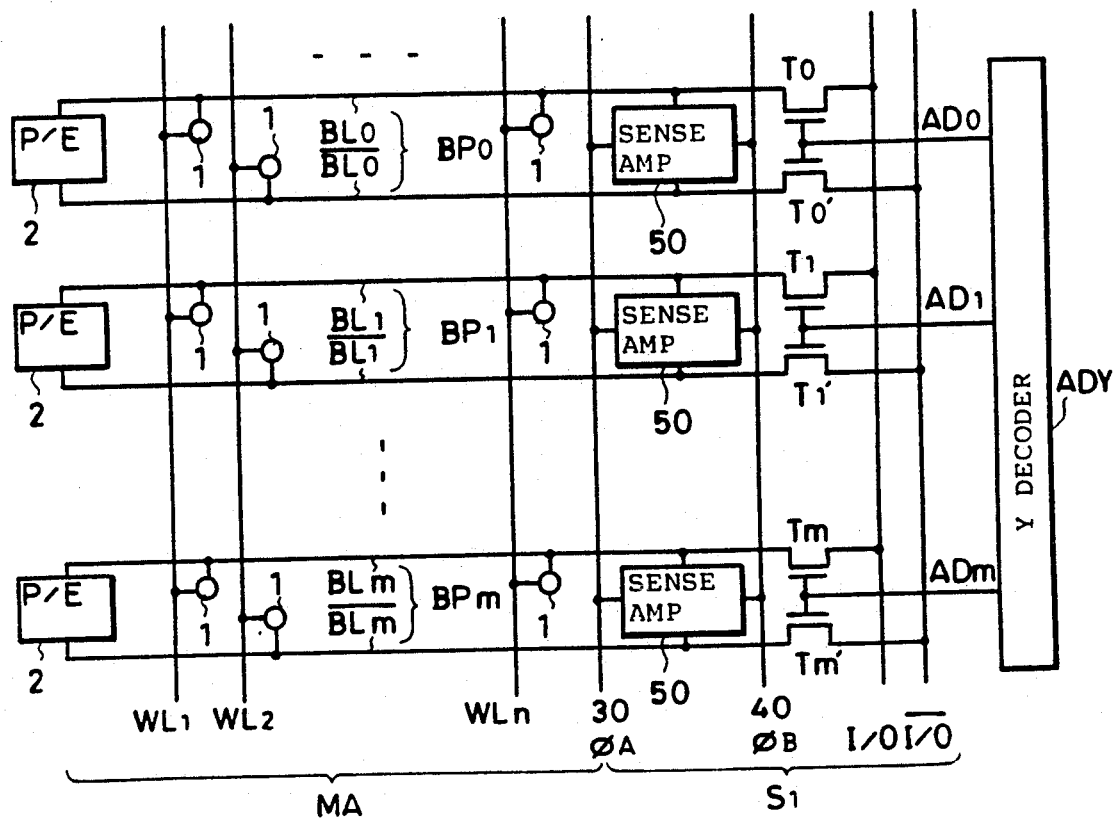
FIG. 2 is a diagram illustrating schematically the configuration of a memory cell array portion of the convention DRAM.
Figure 3:
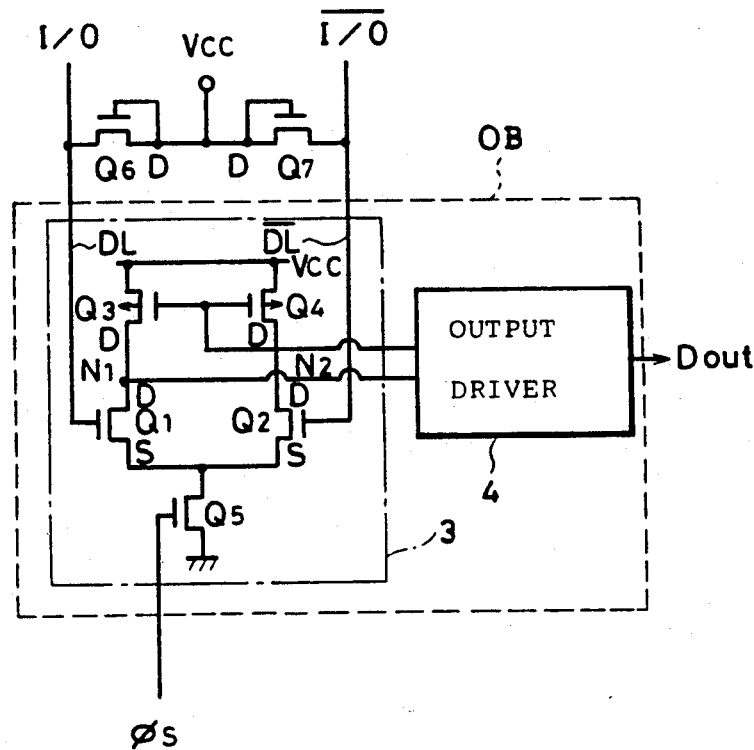
FIG. 3 is a diagram of the configuration of a data reading-out circuit of the conventional DRAM.
Figure 4:
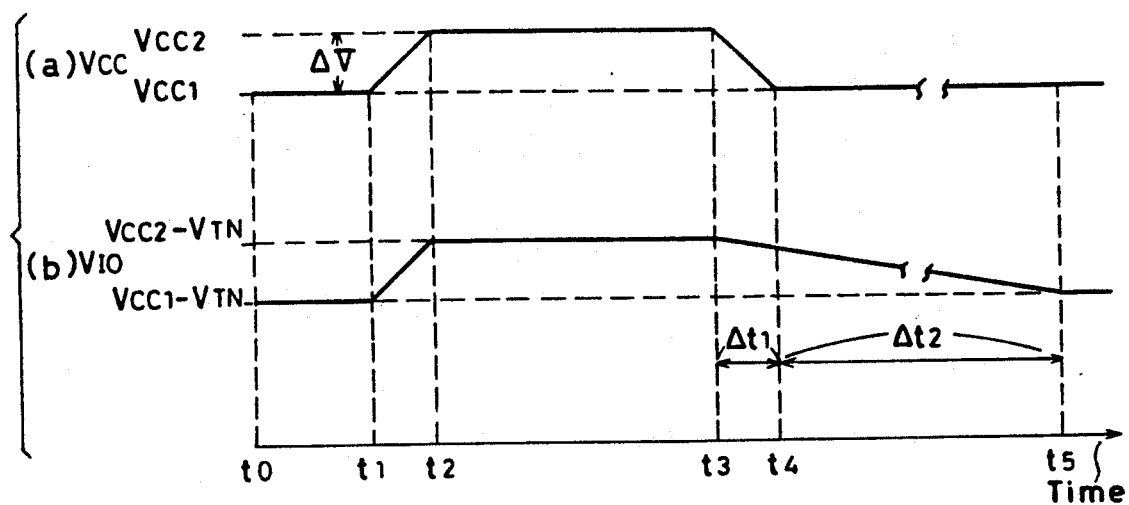
FIG. 4 is a diagram illustrating a relationship between a bias potential of a data output bus and a first supply potential in the conventional DRAM.
Figure 5:
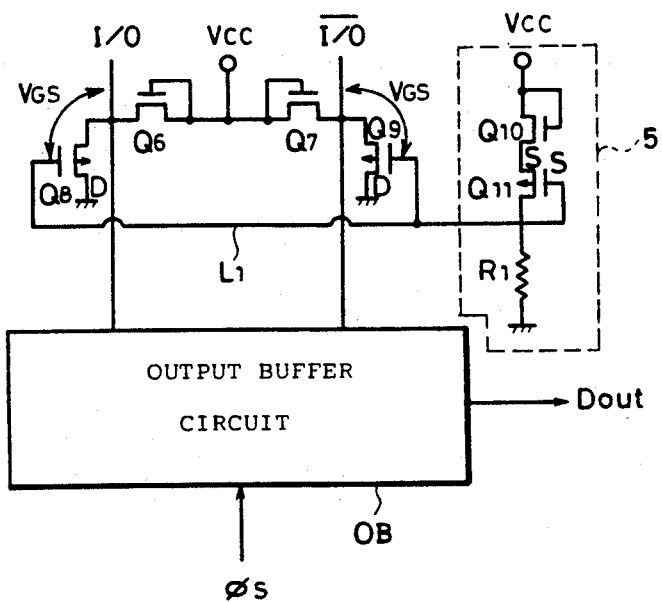
FIG. 5 is a diagram illustrating the configuration of a data reading circuit according to one embodiment of the present invention.

FIG. 5 shows the configuration of a data reading-out circuit portion in the semiconductor device according to an embodiment of the present invention. Referring to FIG. 5, the data read circuit includes a charge potential supply circuit 5 and switching elements Q8 and Q9, for making the potential on the data input/output buses I/O and I/O follow the fluctuation of the supply voltage. Diode-connected n channel MOSFETs Q6 and Q7 and an output buffer circuit OB for reading data provide similar functions and operations to those denoted with like reference numerals in FIG. 3.

The potential supply circuit 5 includes diode-connected n channel and p channel MOSFETs Q10 and Q11, and a resistance R1 with a comparatively high resistivity. The MOSFET Q10 has its gate and drain connected to a first supply potential Vcc. The MOSFET Q11 has its source connected to the source of the MOSFET Q10, and its gate and drain connected to a signal line L1. The resistance R1 is provided between the signal line L1 and a second supply potential (a ground potential). The MOSFET Q10 provides a voltage drop of a threshold voltage $V_{TN}$ thereof, while the MOSFET Q11 provides a voltage drop of $|V_{TP}|$. The $|V_{TP}|$ is a threshold voltage of the p channel MOSFET Q11. The resistance R1 is provided to prevent the potential on the signal line L1 from rising to a predetermined potential or more due to a leak current through a MOSFET or the like. The resistance R1 further provides a current path through the first supply potential Vcc to the second supply potential (the ground potential), and applies a predetermined signal potential to the signal line L1 through this current path.

The switching element Q8 is formed of a p channel MOSFET Q8. The MOSFET Q8 has its source connected to the data input/output bus I/O, its drain connected to the second supply potential (the ground potential) and its gate connected to the signal line L1. The switching element Q9 is formed of a p channel MOSFET Q9. The MOSFET Q9 has its source connected to the complementary data input/output bus I/O, its drain connected to the ground potential, and its gate connected to the signal line L1.

Figure 6:
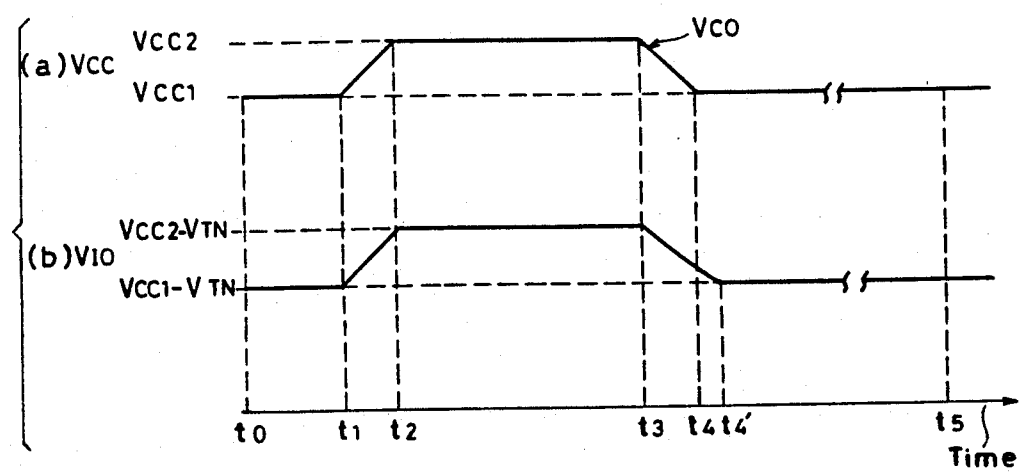
FIG. 6 is a diagram illustrating a relationship between the bias potential of the data output bus and the first supply potential according to the circuit configuration in FIG. 5.

An operation of the circuit shown in FIG. 5 will now be described with reference to FIG. 6. FIG. 6 shows a shift of an input/output potential $V_{IO}$ corresponding to a shift of the supply voltage Vcc. Due to the voltage drop by respective threshold voltages of the MOSFETs Q10 and Q11, the potential supply circuit 5 provides a potential $V_{L1}$ onto the signal line L1, which is expressed as:

$$V_{L1} \sim Vcc - V_{TN} - |V_{TP}|$$

The supply voltage Vcc attains the potential Vcc1 during the period from the time t0 to t1. In this state, the input potential $V_{IO}$ is set to the potential of (Vcc1 − $V_{TN}$) via MOSFETs Q6 and Q7 as in the conventional. Meanwhile, the potential $V_{L1}$ on the signal line L1 is set to the potential of (Vcc − $V_{TN}$ − |$V_{TP}$|) as described above. Therefore, the potential differences between the respective gates and sources of the MOSFETs Q8 and Q9 both attain the value of |$V_{TP}$|. Accordingly, the p channel MOSFETs Q8 and Q9 are in a critical state between a conductive state and a non-conductive state. Thus, there are little current flowing from the data input/output buses I/O and I/O to the second power supply (the ground potential) via the p channel MOSFETs Q8 and Q9. As a result, the input/output potential $V_{IO}$ is kept at the potential of (Vcc1 − $V_{TN}$) from the time t0 to the time t1.

The supply potential Vcc starts rising from the potential level Vcc1 to the level Vcc2 at the time t1. In this case the MOSFETs Q6 and Q7 are ON, and the potential $V_{IO}$ on the data input/output buses I/O and I/O also rises to the level of (Vcc2 − $V_{TN}$). Further, the potential of the signal line L1 also rises, so that the potential differences between the respective sources and gates of the p channel MOSFETs Q8 and Q9 both attain the |$V_{TP}$| and thus they are not turned on. Therefore, the input/output potential $V_{IO}$ also rises in accordance with this potential rising as in the conventional.

The supply voltage Vcc falls from the level Vcc2 down to the Vcc1 during the period from the time t3 to the time 4. It is now assumed that the supply voltage Vcc at around the time t3 is Vco (<Vcc2). At around the time t3, the n channel MOSFETs Q6 and Q7 are turned off because the supply voltage Vco is lowered below the input/output potential $V_{IO}$, so that the input/output potential $V_{IO}$ is kept at the value of (Vcc2 − $V_{TN}$). Meanwhile, the potential VL1 on the signal line L1 attains the value of (Vco − $V_{TN}$ − |$V_{TP}$|). As a result, the potential differences between the respective sources and gates of the p channel MOSFETs Q8 and Q9 attain the value of $(VCC2 - V_{co}) + |V_{TP}| > |V_{TP}|$. Accordingly, the p channel MOSFETs Q8 and Q9 are turned on to let the current flow therethrough from the data input/output buses I/O and I/O to the second supply potential (the ground potential level), so that the input/output potential $V_{IO}$ also falls down from the Vcc2.

Thereafter, even if the n channel MOSFETs Q6 and Q7 are OFF, the p channel MOSFETS Q8 and Q9 are turned on, so that the input/output potential $V_{IO}$ is also lowered as the potential of the supply voltage Vcc is lowered. Accordingly, the data input/output potential $V_{IO}$ also reaches the value of (Vcc1 − $V_{TN}$) at the time t4,, which is almost the same time as the time t4, as shown in FIG. 6.

After the time t4', the MOSFETs Q6 and Q7 are again turned on, while the p channel MOSFETs Q8 and Q9 are not turned on but in a critical state between ON and OFF, whereby the input/output potential $V_{IO}$ is kept at the potential of (Vcc1 − $V_{TN}$).

As has been described, since the input/output potential $V_{IO}$ changes without delay in accordance with the change of the supply voltage Vcc, the input/output potential $V_{IO}$ always attains the potential of (Vcc − $V_{TN}$) even with the change in the supply voltage Vcc. As a result, since the potential of (Vcc − $V_{TN}$) is always supplied to the gates of the n channel MOSFETs Q1 and Q2 (see FIG. 3) in a current mirror type amplifier circuit 3 (included in the output buffer circuit OB), the change in the supply voltage Vcc does not cause a degraded sensitivity of the amplifier circuit 3, whereby an optimal circuit operation is assured for the output buffer circuit OB.

It is described, on the foregoing embodiment, that the sensitivity of the current mirror type amplifier circuit 3 is enhanced when the input/output potential $V_{IO}$ is set to the value of (Vcc − $V_{TN}$). However, this is only empirically known, so that a configuration shown in FIG. 7 may be employed, if the sensitivity of the current mirror type amplifier circuit 3 is further enhanced when the input/output potential $V_{IO}$ is set to the value of (Vcc − 2$V_{TN}$).

Figure 7:
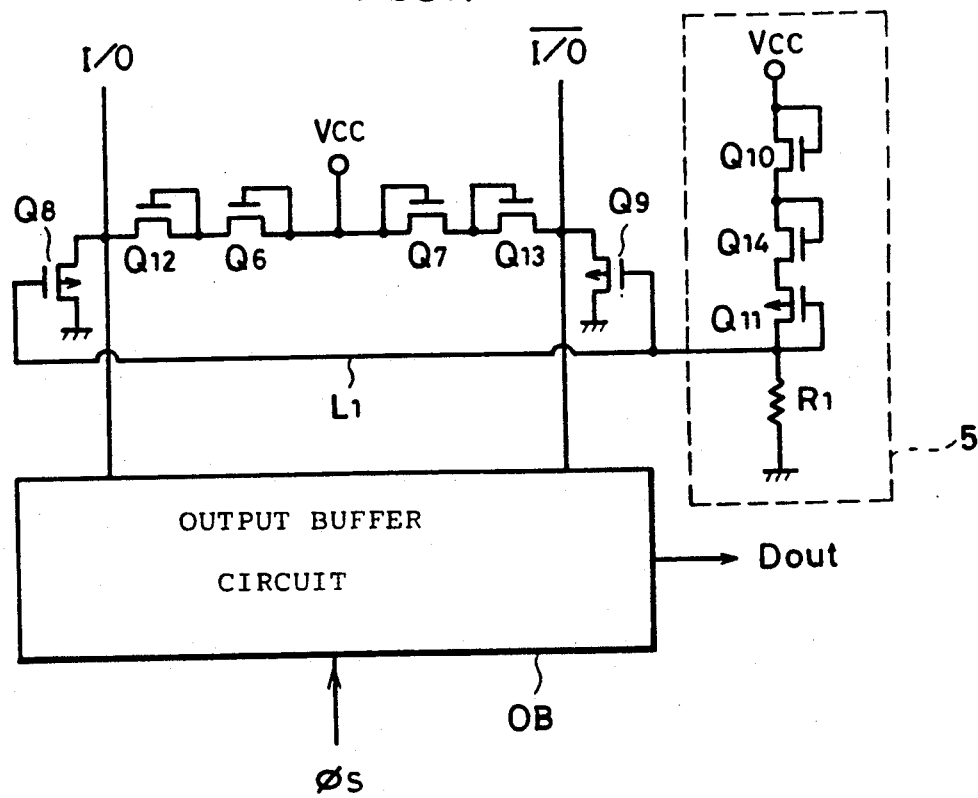
FIG. 7 is a diagram illustrating the configuration of the data read circuit according to another embodiment of the present invention.

Referring to FIG. 7, a potential supply circuit 5 includes an n channel MOSFET Q14, which is diode-connected in a forward direction, provided between the MOSFET Q10 and p channel MOSFET Q11. Furthermore, diode-connected n channel MOSFETs Q12 and Q13 are provided between the data input/output buses I/O and I/O and the n channel MOSFETs Q6 and Q7, respectively, in order to apply a bias potential to the data input/output buses. Accordingly, the bias potential to be transmitted to the data input/output buses falls to the potential of (Vcc−2V$_{TN}$) by the threshold voltages V$_{TN}$ of the n channel MOSFETs Q12 and Q13. Meanwhile, the potential to be transmitted onto the signal line L1 attains the value of (Vcc−2V$_{TN}$−|V$_{TP}$|).

Figure 8:
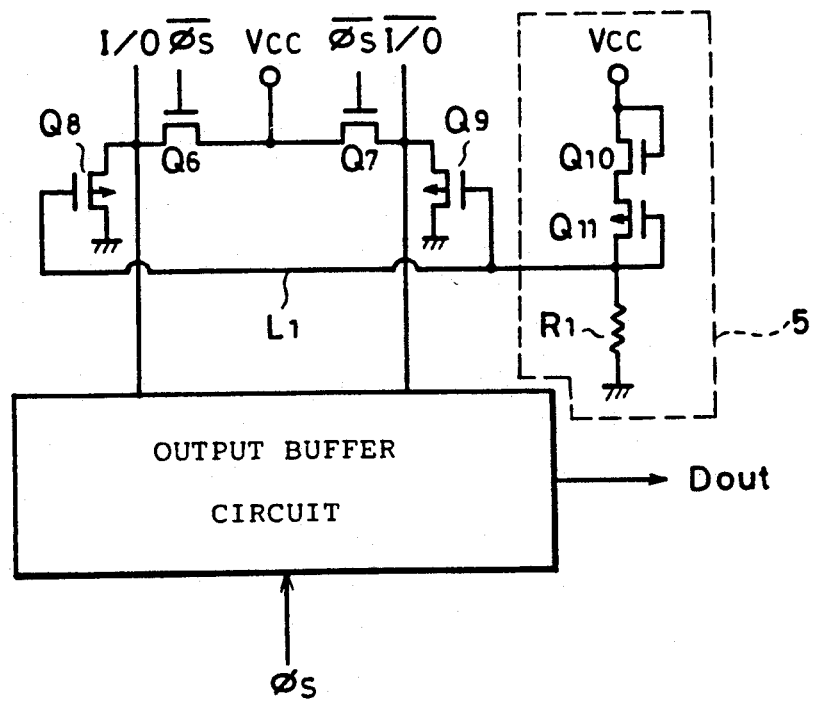
FIG. 8 is a diagram illustrating the configuration of the data read circuit according to a still another embodiment of the present invention.

A configuration shown in FIG. 8 may be employed in place of such configuration that the potential of the data input/output buses I/O and I/O is biased to a predetermined potential by employing the diode-connected MOSFETs as shown n FIGS. 5 and 7. The configuration in FIG. 8 is such that n channel MOSFETs Q6 and Q7 are provided between the first supply potential Vcc and the data input/output buses I/O and I/O, respectively, which have gates receiving an inverted signal φ$_S$ of the sense up activating signal φ$_S$, in place of the diode-connected MOSFETs.

In this configuration, since the level of the inverted signal φ$_S$ does not rise above the supply potential Vcc level, a voltage drop occurs by the threshold voltages of the MOSFETs Q6 and Q7, and thus a desired bias potential can be applied to the data input/output buses I/O and I/O. Moreover, since the data input/output buses I/O and I/O are not charged in the activation of the current mirror type amplifier circuit 3 (see FIG. 3), power consumption can be reduced in the data read circuit portion.

Figure 9:
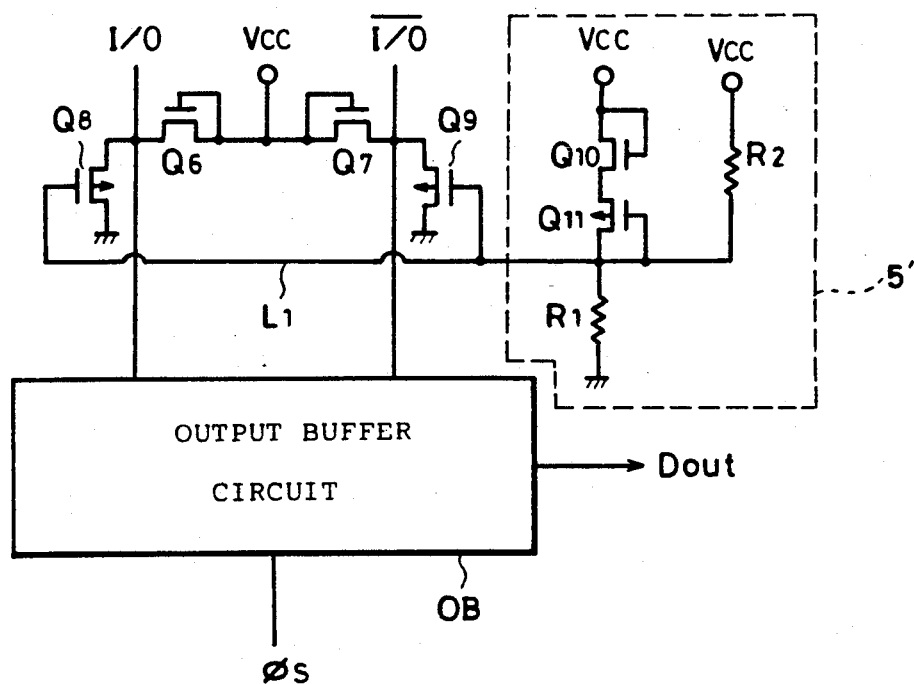
FIG. 9 is a diagram illustrating the configuration of the data read circuit according to a still another embodiment of the present invention.

In the configurations shown in FIGS. 5, 7 and 8, the switching elements Q8 and Q9 are set to the critical state between ON and OFF. In place of these configurations, however, the MOSFETs Q8 and Q9 can reliably be set to the OFF state by employing a configuration in FIG. 9. Referring to FIG. 9, diode-connected MOSFETs Q10 and Q11 are arranged in parallel to a resistance R2 in a potential supply circuit 5'. The resistance R2 has one end connected to the supply potential Vcc and the other end connected to the signal line L1. The resistance value of the resistance R2 is set about 22 to 50 times that of the resistance R1.

In this configuration, the potential V$_{L1}$ on the signal line L1 can be set as follows due to charging via the resistance R2:

$$V_L \sim (Vcc - V_{TN} - |V_{TP}|) + \Delta V'$$

Accordingly, the respective potential differences between the respective sources and gates of the MOSFETs Q8 and Q9 attain the value of (|V$_{TP}$|−ΔV') during the period from the time t0 to the time t3 and after the time t4' in FIG. 6, thereby ensuring the OFF state of the MOSFETs Q8 and Q9. Thus, the current flowing from the input/output data buses I/O and I/O to the ground potential can reliably be set to 0 during the above described period.

In all the described embodiments, the resistance R1 formed of such as polysilicon is provided between the drain of the p channel MOSFET Q11 and the ground level in order to lower the potential on the output signal line L1 below the supply voltage Vcc. However, a resistor-connected MOS transistor can be replaced by this resistance R1. That is, any element having resistive components may be replaced with the resistance R1.

The above described embodiments show the case that the charge potential of the data input/output buses I/O and I/O attains the value of (Vcc−V$_{TN}$) with an operation supply voltage Vcc employed as the first supply potential. However, the present invention is also applicable where the charge potential of the data input/output buses (the bias potential) attains Vcc/2 or (Vcc/2−V$_{TN}$). That is, when the bias potential of the data input/output buses is Vcc/2, the potential of (Vcc/2+V$_{TN}$) may be applied as the first supply potential in place of the Vcc. A circuit for generating the potential of (Vcc/2+V$_{TN}$) can be implemented, for example, simply through a series connection of resistances and a diode-connected MOSFET. Furthermore, when the charge potential of the data input/output buses I/O and I/O attains the Vcc/2−V$_{TN}$, the potential Vcc/2 may be employed as the first supply potential. Namely, the present invention has applicability with any potentials employed as the first supply potential. In addition, a potential V$_{SS}$ rather than the ground potential may be employed in general as the second potential.

All the described embodiments employed, as one example of the semiconductor memory device, the DRAM in which a pair of output buses I/O and I/O is connected to one output buffer circuit. However, the present invention also has applicability to a static RAM having a pair of common data buses corresponding to one output buffer circuit, as shown in FIG. 10.

Figure 10:
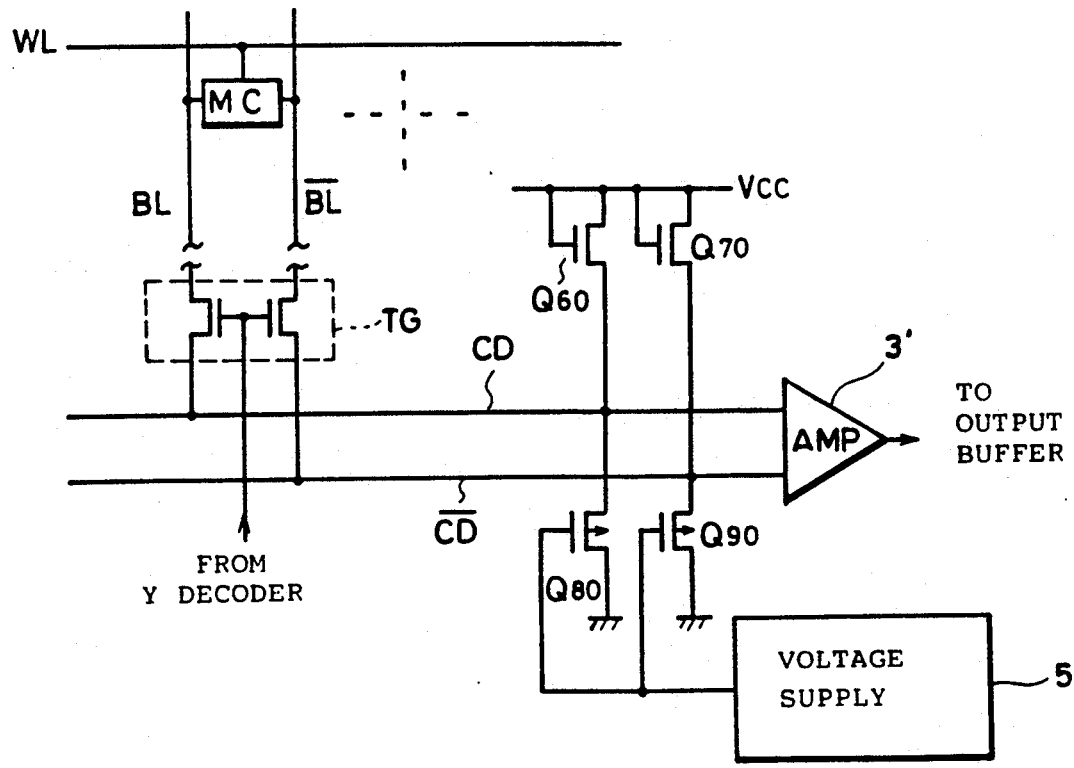
FIG. 10 is a diagram illustrating the configuration of the data read circuit according to a still another embodiment of the present invention.

Referring to FIG. 10, the static RAM includes a plurality of memory cells MC arranged in matrix, a plurality of word lines WL each connected to a row of the memory cells, and a plurality of bit line pairs BL and $\overline{BL}$ each connected to a column of the memory cells. A selecting gate TG is provided which turns on responsive to an output of an Y decoder (not shown) to connect a corresponding pair of the bit lines to common data lines CD and $\overline{CD}$ in order to transmit data of a selected memory cell onto the common data lines CD and $\overline{CD}$. An amplifier 3' is provided for sensing and amplifying a signal potential on the common data lines CD and $\overline{CD}$. The amplifier 3' transmits read-out data to an output buffer. External output data is derived via this output buffer. A static RAM has the configuration of, e.g., a decoder similar to that in a DRAM; however, it differs from a DRAM in that a row address and a column address are accepted at the same timing in the inner portion of the memory by a signal $\overline{CS}$ (or $\overline{CE}$). In the static RAM, each of the memory cells MC is connected to a bit line BL or a complementary bit line $\overline{BL}$, and complementary data to each other are transmitted onto a complementary bit line pair BL and $\overline{BL}$. When a bit line pair BL and $\overline{BL}$ is connected to the common data lines CD and $\overline{CD}$ in response to a decoded column address signal from the Y decoder, the potential on the common data lines changes in accordance with the read-out data. The potential change occurring on the common data lines is amplified by the amplifier 3' and transmitted as read-out data to the output buffer. Therefore, it is also necessary in this static RAM that the respective potentials on these common data lines are biased to a predetermined potential for a proper operation of the amplifier 3'. Thus, diode-connected n channel MOSFETs Q60 and Q70 charge the common data lines CD and $\overline{CD}$ to a predetermined potential of (Vcc−V$_{TN}$), and in addition, switching elements Q80 and Q90 are connected to the respective common data lines CD and $\overline{CD}$ in order to make the potential change on these common data lines follow the change in a supply voltage potential. Furthermore, a potential supply circuit 5 is provided for controlling operations of these switching elements Q80 and Q90. A output of the potential supply circuit 5 is supplied to the gates of the MOSFETs Q80 and Q90. Such configuration as above can cause the potential on the common data lines to change in accordance with a fluctuation in the supply voltage, resulting in the proper operation of the amplifier circuit 3'.

Figure 11:
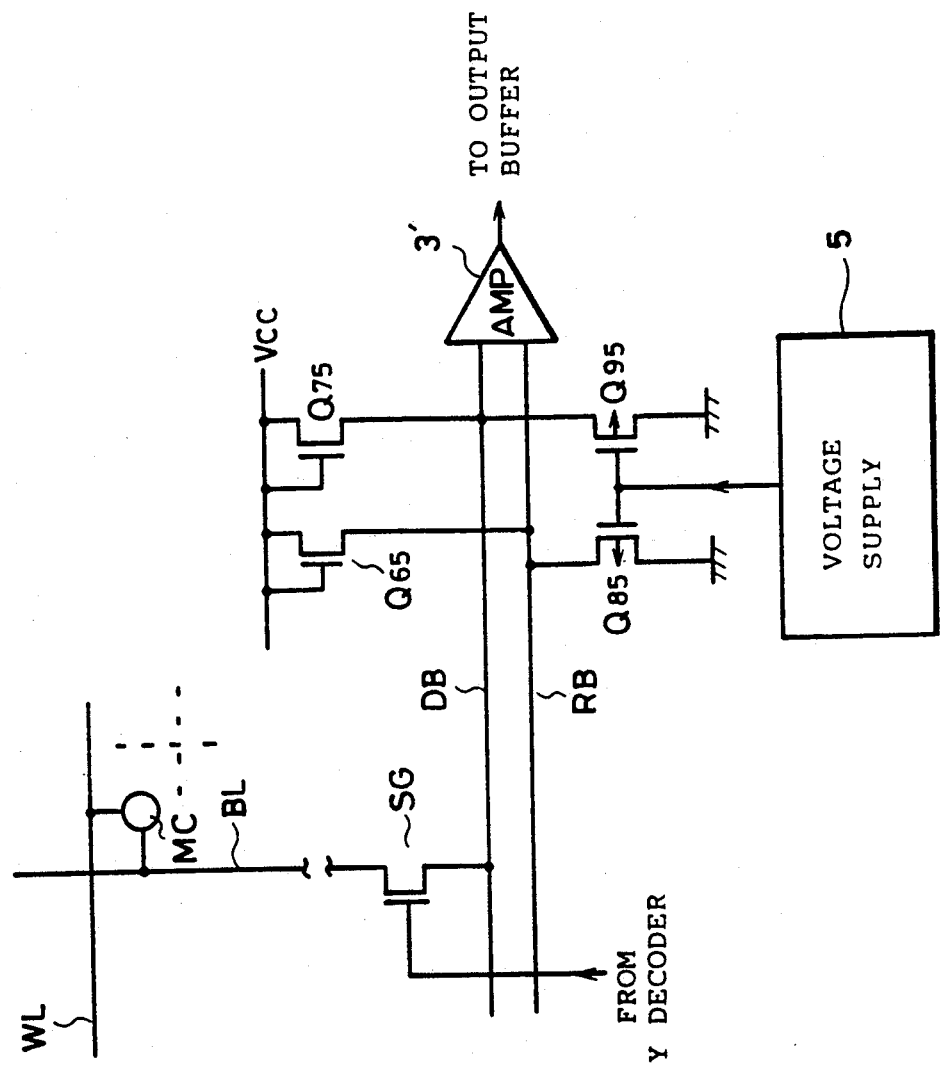
FIG. 11 is a diagram illustrating the configuration of the data read circuit according to a still another embodiment of the present invention.

Such case has been described in the foregoing embodiments that the data of the memory cells is capable of both being written in and read out. However, the present invention is also applicable to such a configuration as read only memory ROM where the contents of the memory cells are fixed. That is, the same configuration as of the RAM is provided in the ROM shown in FIG. 11; however, a single bit line scheme that a bit line BL does not form a pair is employed and each of the bit lines BL is connected to a single data bus DB via a selecting gate SG. Therefore, in order to detect and amplify the potential on this data bus DB, it is necessary to apply a reference voltage to a reference voltage signal line RB, and to compare this reference voltage with a signal potential on the data bus DB and amplify the read-out data. In this case, the potential on the reference voltage supply line RB is made to have the same voltage as a bias voltage of the data bus DB.

Thus, the same effect can be achieved in the ROM as in the above described embodiments by providing to the data bus DB and the reference voltage supply line RB, respectively, diode-connected n channel MOSFETs Q65 and Q75 for bias voltage supply, and p channel MOSFETs Q85 and Q95 and a voltage supply circuit 5 which serve to let the potential deviation of the data bus DB and the reference voltage supply bus RB follow the fluctuation in the supply voltage. The MOSFET Q75 charges the data bus DB to the potential of (Vcc−$V_{TN}$), and the MOSFET Q65 biases the reference voltage supply line RB to the potential of (Vcc−$V_{TN}$). The p channel MOSFETs Q85 and Q95 discharge the reference voltage supply bus RB and the data bus DB, respectively. The voltage supply circuit 5 controls ON/OFF of the p channel MOSFETs Q85 and Q95.

Furthermore, the same effect as in the above described embodiments can also be achieved in all the embodiments described above even if P and N polarities of the MOSFETs are replaced with each other, and further the power supply Vcc and the ground level are replaced with each other, or if the vcc is set to 0V and the ground potential level to −Vcc.

According to the present invention as aforementioned, even in the case that the transistor for biasing the data transmitting line is turned off due to the fluctuation of the first power supply potential so as not to be able to supply a desired potential onto the data transmitting line, the switching elements are rendered conductive so as to set the potential on the data transmitting line to a predetermined potential. Consequently, it becomes possible for the potential on the data transmitting line to follow the fluctuation of the first supply potential at a high speed, resulting in an optimal operation in the data output circuit ever with a power supply voltage fluctuated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a plurality of memory cells arranged in a matrix of rows and columns;
    a plurality of common signal lines each connected to a row of said plurality of memory cells, each said column signal line transmitting thereon data of a selected memory cell;
    means responsive to an external address for selecting a corresponding column signal line;
    a data output bus for having a signal transmitted from a selected column signal line;
    means for sensing and amplifying the signal on said data output bus;
    first potential setting means provided between a first supply potential and said data output bus for setting said data output bus to a first predetermined potential; and
    second potential setting means for detecting a potential on said data output bus and for setting said data output bus to said first predetermined potential in response to the detected potential.

2. A semiconductor memory device in accordance with claim 1, wherein:
    said first potential setting means comprises means for supplying said data output bus with said first predetermined potential being provided as a function of said first supply potential; and
    said second potential setting means comprises means activated when a detected potential on said data output bus shifts toward said first supply potential from the first predetermined potential, for coupling said data output bus to a second supply potential, thereby resetting said data output bus to said first predetermined potential.

3. A semiconductor memory device in accordance with claim 1, wherein
    said second potential setting means comprises
    first switching element means provided between said data output bus and a second supply potential, and having a threshold voltage for determining conduction/non-conduction thereof, and
    means for applying to a control terminal of said first switching element means a control voltage having a value shifted in the direction of said second supply potential from said first predetermined potential by an amount substantially equal to said threshold voltage.

4. A semiconductor memory device in accordance with claim 3, wherein
    said first potential setting means comprises at least one second switching element means of a first polarity having a threshold voltage and provided between said first supply potential and said data output bus, said second switching element means providing a voltage drop with a value of said threshold voltage thereby setting said data output bus to a potential which is less than said first supply potential by a value equal to the number of said second switching element means multiplied by said threshold voltage; and
    said control voltage applying means comprises a series connection of third switching element means of said first polarity, fourth switching element means of a second polarity and a resistor between said first supply potential and the control terminal of said first switching element means; and the number of said third switching element means is the same as that of said second switching element means, and the number of said fourth switching element means is the same as that of said first switching element means.

5. A semiconductor memory device in accordance with claim 4, wherein said first, second, third and fourth switching element means each comprise an insulated gate type field effect transistor.

6. A semiconductor memory device comprising:

a plurality of memory cells arranged in a matrix of rows and columns;

a plurality of bit line pairs each connected to a column of said plurality of memory cells and comprising first and second bit lines for transmitting complementary data therethrough;

means responsive to an external address for selecting a corresponding bit line pair;

a data output bus for having a signal transmitted from a selected pair of the bit lines therethrough, said data output bus having a first data output line for transmitting a signal from said first bit line therethrough and a second data output line for transmitting therethrough a signal from said second bit line;

means for sensing and amplifying a potential difference on said data output bus;

first potential setting means provided between a first supply potential and each of said first and second data output lines, for setting said first and second data output lines to a first predetermined potential; and second potential setting means for detecting respective potentials on said first and second data output lines and for setting said first and second data output lines to said first predetermined potential in response to the detected respective potentials.

7. A semiconductor memory device in accordance with claim 6, wherein said first potential setting means comprises first means provided between said first supply potential and said first output line for supplying said first data output line with said first predetermined potential, and second means provided between said first supply potential and said second data output line for supplying said second data output line with said first predetermined potential, said first potential being provided as a function of said first supply potential; and said second potential setting means comprises means, activated when detected potential on said first and second data output lines are shifted toward said first supply potential from said first predetermined potential, for resetting said first and second data output lines to said first predetermined potential.

8. A semiconductor memory device in accordance with claim 6, wherein said second potential setting means comprises first switching element means provided between said first data output line and a second power supply potential, second switching element means provided between said second data output line and said second power supply potential, each of said first and second switching element means having a threshold voltage for determining conduction/non-conduction thereof, and means for applying to a control terminal of each said first and second switching element means a control voltage having a value shifted in the direction of said second supply potential from said first predetermined potential by an amount substantially equal to said threshold voltage.

9. A semiconductor memory device in accordance with claim 8, wherein said first potential setting means comprises first and second supplying means for supplying said first and second output lines with a first potential, respectively, said first and second supplying means each comprising at least one third switching element means of a first polarity, said third switching element means having a threshold voltage for determining conduction/non-conduction thereof;

said third switching element means provided a voltage drop with a value of the threshold voltage thereof, thereby setting said first and second data output lines to a potential which is less than said first supply potential, by a value equal to the number of said third switching element means multiplied by said threshold voltage;

said first and second switching element means being of a second polarity; and wherein said control voltage applying means comprises a series connection of fourth switching element means of said first polarity and fifth switching element means of said second polarity, provided between said first supply potential and the control terminal of each said first and second switching element means, the number of said fourth switching element means, and the number of said fifth switching element means being the same as that of said first switching element means, and said first and second supplying means comprising the same number of switching element means.

10. A semiconductor memory device in accordance with claim 9, wherein said first, second, third, fourth and fifth switching element means each comprises an insulated gate type field effect transistor.

11. A semiconductor memory device comprising:

a plurality of memory cells arranged in a matrix of rows and columns;

a plurality of bit lines each connected to a column of said plurality of memory cells;

means responsive to an external address for selecting a corresponding bit line;

a data output line for transmitting therethrough a signal from a selected one of the bit lines;

a reference voltage supply line for transmitting a reference voltage;

means for sensing and amplifying a potential difference between said reference voltage supply line and said data output line;

first potential setting means provided between a first power supply potential and said data output link for setting said data output line to a first predetermined potential;

second potential setting means for detecting a potential on said data output line and for setting said data output line to said first predetermined potential in response to the detected potential;

third potential setting means provided between said first power supply potential and said reference voltage supply line for setting said reference voltage supply line to the first predetermined potential; and fourth potential setting means for detecting a potential on said data reference voltage supply line and for setting said reference voltage supply line to said first predetermined potential response to the detected potential.

12. A semiconductor memory device in accordance with claim 11, wherein
   said first potential setting means comprises first supplying means for supplying said data output line with said first predetermined potential, said first predetermined potential being provided as a function of said first power supply potential;
   said third potential setting means comprises second supplying means for supplying said reference voltage supply signal line with said first predetermined potential;
   said second potential setting means comprises means, activated when a first detected potential on said data output line is shifted from said first predetermined potential towards said first power supply potential, for resetting said data output line to said first predetermined potential; and
   said fourth potential setting means comprises means, activated when a second detected potential on said reference voltage supply line is shifted from said first predetermined potential said reference voltage supply line to said first predetermined potential.

13. A semiconductor memory device in accordance with claim 11, wherein
   said second potential setting means comprises
   first switching element means provided between said data output line and a second power supply, said first switching element means having a threshold voltage for determining conduction/non-conduction thereof, and
   means for applying to a control terminal of said first switching element means a control voltage having a value shifted in the direction of said second supply potential from said first predetermined potential by an amount substantially equal to said threshold voltage.

14. A semiconductor memory device in accordance with claim 13, wherein
   said first potential setting means comprises at least one third switching element means of a first polarity having a threshold voltage, said third switching element means providing a voltage drop with a value of said threshold voltage thereby setting said data output line to a potential lower than said first supply potential by a value equal to the number of said third switching element means multiplied by said threshold voltage;
   said first switching element means is formed of at least one switching transistor of a second polarity;
   said control voltage applying means comprises a series connection of fourth switching element means of said second polarity, and is arranged between said first power supply potential and the control terminal of said first switching element means; and the number of said fourth switching element means is the same as that of said third switching element means, and the number of said fifth switching element means is the same as that of said first switching element means.

15. A semiconductor memory device in accordance with claim 14, wherein
   said first, second, third, fourth and fifth switching element means each comprises an insulated gate type field effect transistor.

16. A method of stabilizing a voltage on a data output line in a semiconductor memory device, said semiconductor memory device having a plurality of memory cells arranged in a matrix of rows and columns, column signal lines each connected to a column of said plurality of memory cells, a data output bus for transmitting therethrough a signal received from a selected one of the column signal lines, means for sensing and amplifying a signal on said data output bus, and circuit means provided between a first supply potential and said data output bus for setting said data output bus to a first predetermined potential, said method comprising the steps of:
   (a) detecting a potential on said data output bus; and
   (b) resetting said data output bus to said first predetermined potential in response to a deviation in the detected potential from said first predetermined potential.

17. A method of claim 16, wherein
   in step (b) said data output bus is reset to said first predetermined potential in response to a detected potential on said data output bus becoming higher than said first predetermined potential.

18. A method of claim 17, wherein
   in step (b) said data output bus is coupled to a second supply potential.

19. A method of claim 16, wherein
   in step (b) said data output bus is coupled to a second power supply potential to reset said data output bus to said first predetermined potential in response to a shift of detected potential on said data output bus in the direction of said first power supply potential from said first predetermined potential.

* * * * *